United States Patent [19]
French et al.

[11] Patent Number: 6,114,642
[45] Date of Patent: Sep. 5, 2000

[54] SWITCHGEAR ASSEMBLY

[75] Inventors: Thomas G. French, Chicago; Raphael H. Guio, Palatine; Henry W. Kowalyshen, Niles; Buddy B. McGlone, Lombard; Gregory C. Mears; John C. Opfer, both of Chicago, all of Ill.

[73] Assignee: S&C Electric Co., Chicago, Ill.

[21] Appl. No.: 09/210,678

[22] Filed: Dec. 14, 1998

Related U.S. Application Data

[60] Division of application No. 08/705,460, Aug. 29, 1996, Pat. No. 5,864,107, which is a continuation-in-part of application No. 08/653,176, May 24, 1996, abandoned.

[51] Int. Cl.⁷ .............................. H01H 31/00; H01H 9/20
[52] U.S. Cl. .................. 200/293; 200/50.01; 200/50.02; 361/600
[58] Field of Search ............................ 200/50.01, 50.02, 200/17 R, 293, 294, 307, 50.29, 50.39; 218/2, 7, 12, 14, 80, 97, 100, 134, 152, 155; 335/132, 202; 361/600, 605, 606, 610, 611, 621, 622, 624, 627, 628, 631, 641, 643, 647, 652

[56] References Cited

U.S. PATENT DOCUMENTS

| | | | |
|---|---|---|---|
| 3,339,118 | 8/1967 | Harner et al. | 317/114 |
| 3,991,348 | 11/1976 | Evans | 317/114 |
| 4,218,596 | 8/1980 | Clausing | 200/144 R |
| 4,839,477 | 6/1989 | Orosz et al. | 200/50 AA |
| 5,062,022 | 10/1991 | Beard et al. | 361/335 |
| 5,521,567 | 5/1996 | Devonald, III et al. | 335/132 |
| 5,864,107 | 1/1999 | French et al. | 200/50.01 |

*Primary Examiner*—Michael Friedhofer
*Attorney, Agent, or Firm*—James V. Lapacek

[57] ABSTRACT

Switchgear is provided that includes a housing enclosing electrical components having switch blades that establish visible open gaps in an open position. The switchgear includes an array of operating controls and viewing provisions to observe the open switch blades. The operating controls and viewing provisions are accessible from a first direction and are arranged at a first area of the housing while cable interconnection provisions are accessible from a second direction and are arranged at a second area of the housing. Thus, operating personnel can utilize the viewing provisions and the operating controls without being exposed to the area of the cable interconnections. In one specific arrangement, an array of operational displays is provided, with the displays overlying the viewing provisions and being movable to permit use of the viewing provisions. In a preferred arrangement, the switchgear includes multi-pole switchgear assemblies which are assembled from individual pole-unit assemblies. The multi-pole switchgear assemblies are mounted to a housing along a single edge or corner of the switchgear assembly.

15 Claims, 17 Drawing Sheets

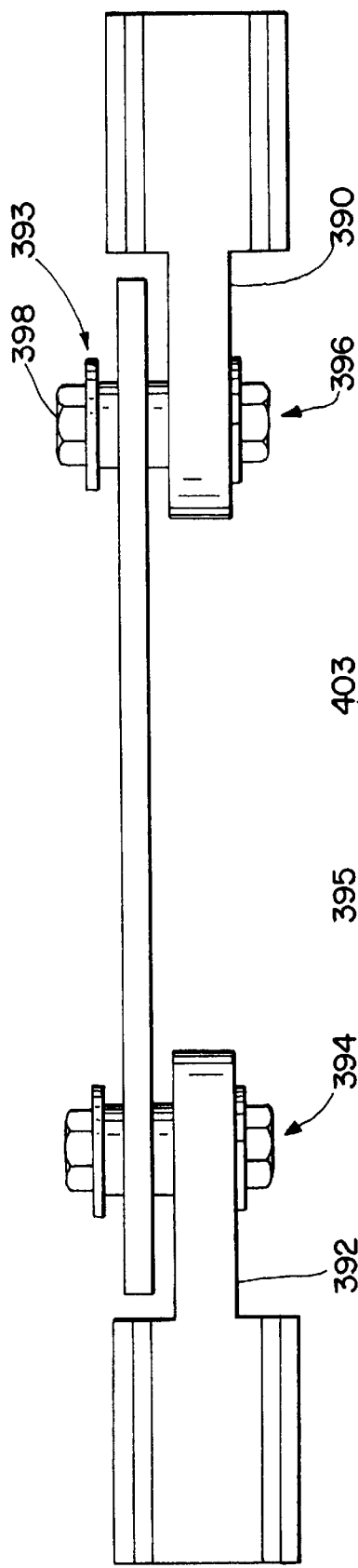
Fig. 20
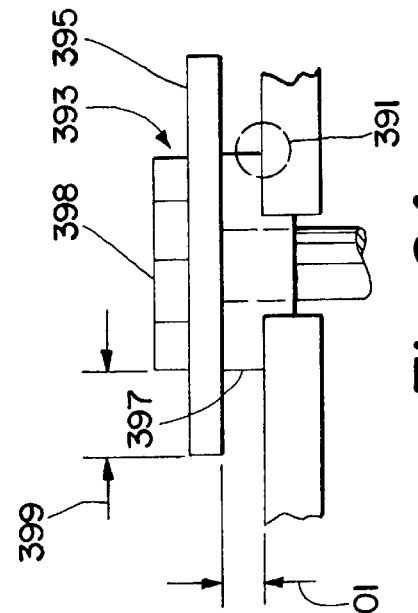
Fig. 24
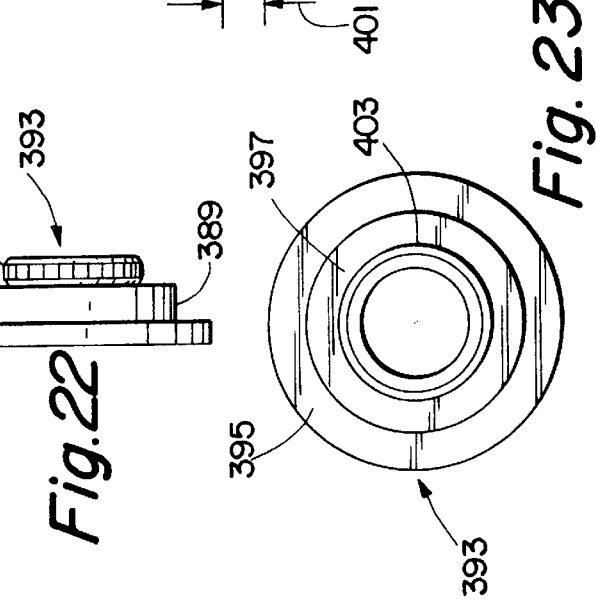
Fig. 22
Fig. 23
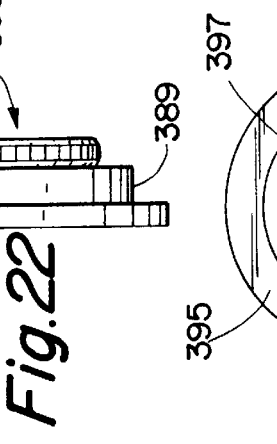
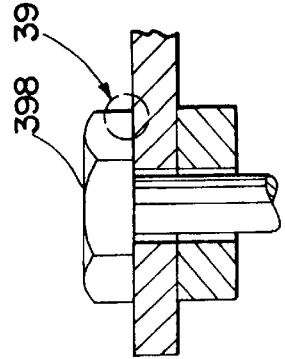
Fig. 21

SWITCHGEAR ASSEMBLY

CROSS REFERENCE TO RELATED APPLICATION

This is a division of application Ser. No. 08/705,460 filed on Aug. 29, 1996, now U.S. Pat. No. 5,864,107.

This application is a continuation-in-part of application Ser. No. 08/653,176 filed May 24, 1996 abandoned in the names of B. B. McGlone et al.

BACKGROUND OF THE INVENTION

1. Field of the Invention

The present invention relates generally to switchgear for the field of electrical power distribution, and more particularly to switchgear that facilitates most operations without exposure to the high voltage environment adjacent cable terminations and the like.

2. Description of the Related Art

Switchgear are generally categorized by various categories and features such as: installation location (e.g. grade or surface, sub-surface etc.); the configuration of components (e.g. load interrupter switches, fuses, fault interrupters, disconnects, sectionalizers, etc.); the cable connections (e.g. elbows, cable terminators); the accessibility of components and controls; the medium within the switchgear enclosure, for example air, vacuum, oil, gas (such as $SF_6$), etc.; and additional features such as fault indicators, voltage indicators, power operation, automatic fault interruption control, etc. For example, switchgear that incorporate the combination of a vacuum interrupter with a series connected visible disconnect is disclosed in U.S. Pat. No. 4,484,046 and illustrated in the Square D Bulletin SY-9T (9/86). In the arrangement of the aforementioned U.S. Pat. No. 4,484,046, the visible disconnect is also connected to a ground when moved to the opened position. Another arrangement, Type RGC switchgear available from ABB and illustrated in Catalog publication N-H 5194 E, utilizes a loadbreak switch and series connected disconnect that is visible and connected to ground in an open position, the loadbreak switch and the disconnect being disposed in an $SF_6$ environment. Another arrangement disclosed in U.S. Pat. No. 5,508,486 is directed to gas-insulated switchgear having exit passages and a drive device for the internal multi-pole vacuum switch and multi-pole circuit breaker arranged on a front wall of the switchgear housing, the vacuum switching tubes being arranged at right angles to the front wall and the axis of rotation of the switch shaft of the circuit breaker being horizontal and parallel to the front wall of the housing.

While these prior art arrangements may be useful to provide switchgear of various configurations, the prior arrangements are rather awkward to operate and require exposure to the area of the high-voltage cables, do not offer desirable viewing of the open gap of the internal switches, and do not include basic configurations or features that permit the switchgear to be installed in different environments and in different mounting configurations. Switchgear that alleviates many of these drawbacks is shown in U.S. Pat. No. 5,521,567. However, additional operational and structural features would be desirable to enhance the usability and producability of this type of switchgear.

SUMMARY OF THE INVENTION

Accordingly, it is a principal object of the present invention to provide a desirable configuration of switchgear for ease of operation and viewing of the open gap of internal switches without exposure to any high-voltage.

It is another object of the present invention to provide switchgear that includes arrays of viewing windows, movable informational displays that overlie the viewing windows, and operating controls that are all accessible without any exposure to cable interconnections.

It is a further object of the present invention to provide switchgear that has excellent producability characteristics, ensures the accurate alignment of components and is adaptable to provide a variety of component configurations.

It is yet another object of the present invention to provide switchgear component assemblies that are easily assembled from pole-unit assemblies, such that different configurations are easily achieved.

It is an additional object of the present invention to provide multi-pole switchgear assemblies that are adapted for mounting from a single edge of the assemblies such that an array of such multi-pole assemblies are mounted within a housing on a narrow planar surface.

These and other objects of the present invention are efficiently achieved by the provision of switchgear including a housing enclosing electrical components having switch blades that establish visible open gaps in an open position. The switchgear includes an array of operating controls and viewing provisions to observe the open switch blades. The operating controls and viewing provisions are accessible from a first direction and are arranged at a first area of the housing while cable interconnection provisions are accessible from a second direction and are arranged at a second area of the housing. Thus, operating personnel can utilize the viewing provisions and the operating controls without being exposed to the area of the cable interconnections. In one specific arrangement, an array of operational displays is provided, with the displays overlying the viewing provisions and being movable to permit use of the viewing provisions. In a preferred arrangement, the switchgear includes multi-pole switchgear assemblies which are assembled from individual pole-unit assemblies. The multi-pole switchgear assemblies are mounted to a housing along a single edge or corner of the switchgear assembly.

BRIEF DESCRIPTION OF THE DRAWING

The invention, both as to its organization and method of operation, together with further objects and advantages thereof, will best be understood by reference to the specification taken in conjunction with the accompanying drawing in which:

FIG. 20 is an elevational view partly in section and with parts cut away for clarity illustrating a separation spacer of the switchgear of FIGS. 1–19;

FIG. 21 is a diagrammatic illustration of dielectric stress utilizing conventional fastening and support methods;

FIGS. 22 and 23 are top plan and right side elevational views, respectively, of the separation spacer of FIG. 20;

FIG. 24 is a diagrammatic illustration of the separation spacer of the present invention of FIG. 20.

DETAILED DESCRIPTION

Figure 1:
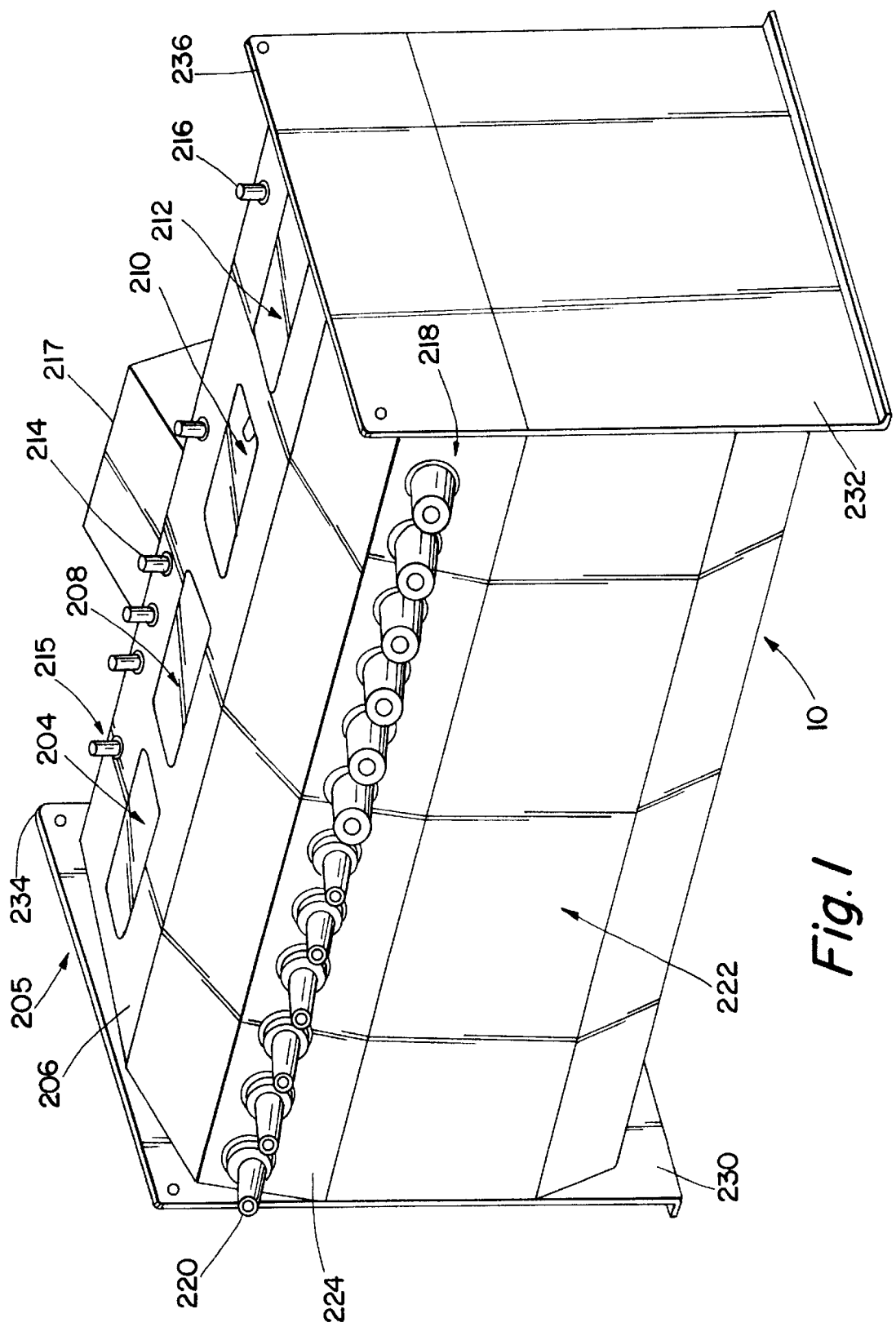
FIG. 1 is a perspective view of switchgear according to a first embodiment of the present invention.
Figure 2:
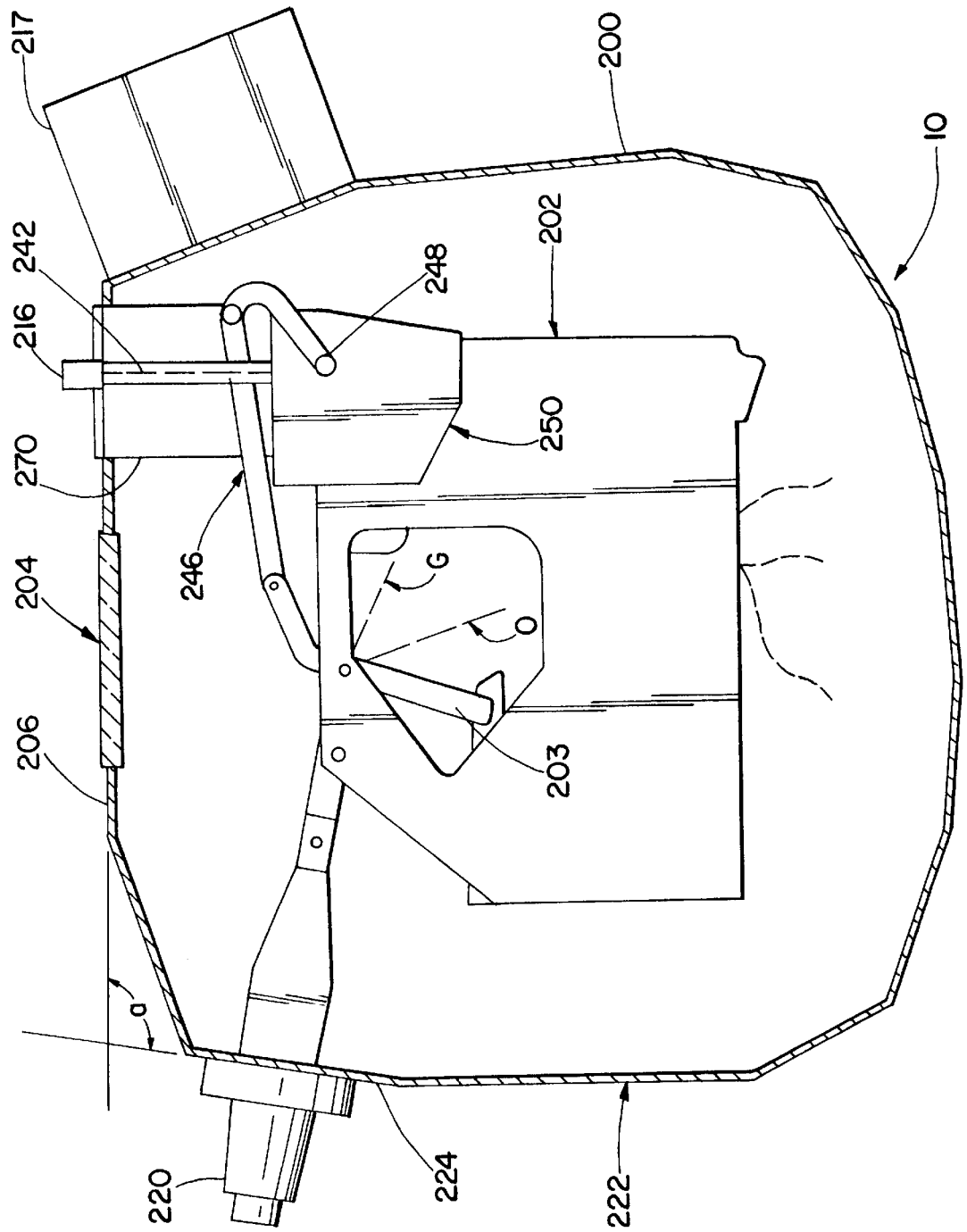
FIG. 2 is a right-side elevational view of the switchgear of FIG. 1 partly in section and with parts cutaway for clarity.
Figure 3:
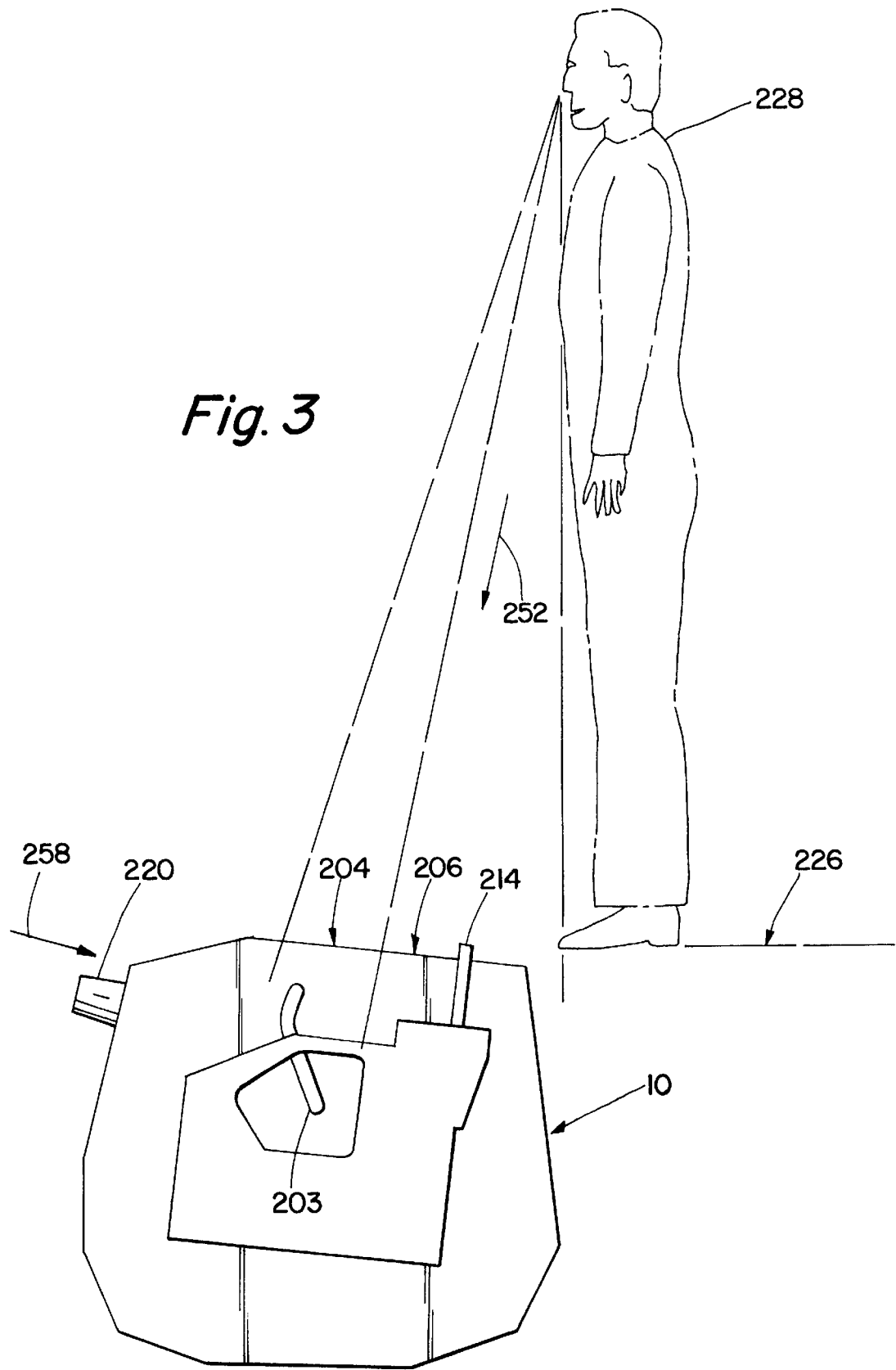
FIG. 3 is a diagrammatic representation of the switchgear of FIGS. 1 and 2 illustrating the features and operation of the switchgear.

Referring now to FIGS. 1–3, the switchgear 10 of the present invention provides various predetermined configurations/combinations of load interrupter switches and resettable fault interrupters in a switchgear lineup having a pressurized, gas-filed volume within a housing 200. The housing 200 is an elongated, monocoque shell with a polygonal cross-section to provide suitable clearances and predetermined functions in structural strength, mounting and supporting the various components, e.g. the load interrupter switch 202 illustrated in FIG. 2.

The switchgear 10 defines one or more viewing windows, e.g. 204, along a top surface 206 of the housing 200, preferably arranged as an aligned row or first array 205 with one viewing window, e.g. 204, aligned immediately above one or more switch blades 203 of each load interrupter switch 202 or other switch component. For example, as shown in FIG. 2, viewing windows 204, 208, 210, and 212 are arranged above a respective lineup of a first load interrupter switch, a resettable fault interrupter, and second and third load interrupter switches. A second aligned row or second array 215 of controls, e.g. illustrative operation selectors 214, 216, is also provided along the top surface 206 of the housing 200. The second array 215 is spaced apart from the first array 205 of the viewing windows, with the general directions defined generally by each of the arrays 205 and 215 being generally parallel.

Figure 6:
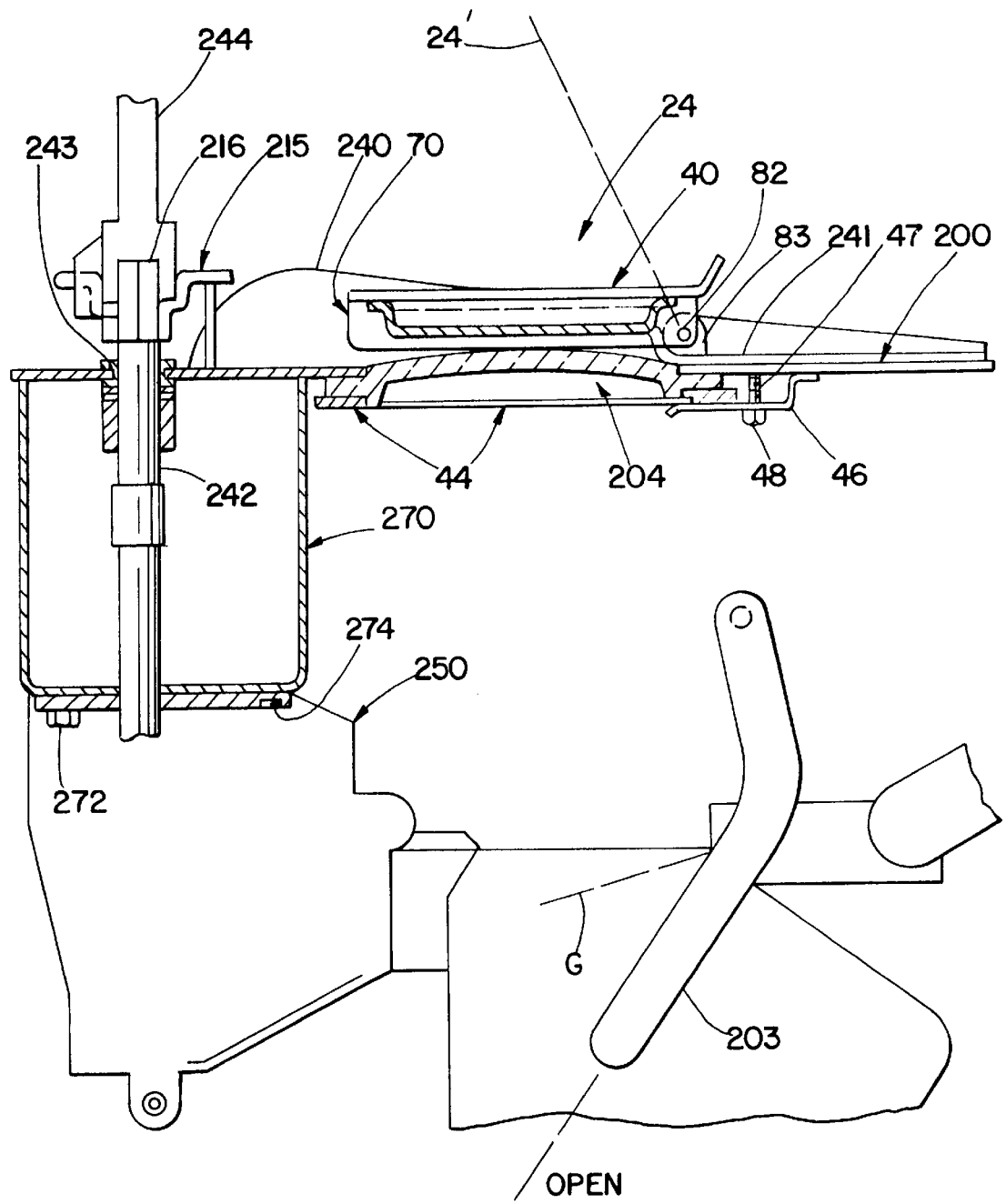
FIG. 6 is a left-side elevational view of the switchgear of FIG. 4 partly in section and with parts cutaway for clarity.

The operation selectors such as 214, 216 are utilized to operate the load interrupter switches and resettable fault interrupters via a removable handle 244 shown in FIG. 6. As shown in FIG. 2, the operation selector 216 is for operation of a three-pole load interrupter switch and the operation selector 214 is for operation of a disconnect function of one pole of a three-pole resettable fault interrupter. It should also be understood that in other arrangements, the third array 215 also includes indicators, test features etc. A control housing 217 extending to the rear of the housing 200 is provided for trip control of resettable fault interrupter components.

The switch blade 203 is shown in the closed position in FIG. 3. The open position of the switch blade 203 is referenced at "O" while a third, ground position is referenced at "G". The plane of rotation defined by the operating positions of the switch blade 203 is generally perpendicular to the top surface 206. The switch blades 203 are operated via linkage generally referred to at 246 connected to a switch operating shaft 248. The switch operating shaft 248 is driven by an operating mechanism generally referred to at 250 and operated by the operation selector 216 through an operating shaft 242. The switch operating shaft 248 is arranged generally parallel to each of the top surface 206 and the front surface 224.

The switchgear 10 also includes a third aligned row or third array 218 of external interconnections such as bushings 220 for connection to elbow connectors or the like which terminate power distribution cables of an electrical power distribution system. The third array 218 of external interconnections provides electrical connection to the various internal electrical components such as each pole of the load interrupter switches 202 and resettable fault interrupters. The third array 218 of bushings 220 is arranged generally along the front surface 222 of the housing 200, and more specifically in a preferred embodiment, along a surface 224 that is inclined with respect to the generally vertical front surface 222. In a preferred embodiment, the general direction defined generally by the third array 218 is generally parallel to the first and second arrays 205, 215.

Accordingly, the first array 205 of the viewing windows and the second array 215 of the controls are arranged along a first surface 206 of the housing 200 and the third array 218 of bushings 220 for cable interconnection provisions (e.g. to connect to elbows on cables) are arranged along an angled frontal surface 224, spaced away from and forming an angle "a" with respect to the surfaces on which the first and second arrays 205 and 215 are located. The angle "a" can be referred to as being generally perpendicular. In one specific arrangement, the angle "a" is approximately 100 degrees, while a range of 90–110 degrees has been found desirable. The first and second arrays 205 and 215 of viewing windows and controls can also be characterized as being accessible from a first direction and being arranged at a first area of the housing 200, while the third array 218 of external interconnections is accessible from a second direction and is arranged at a second area of the housing 200. Of course, it should be realized that the first array 205 can be characterized as being located at a first area, the second array 215 being located at a second area, and the third array 218 being located at a third area, where the first and second areas are each accessible from the first direction and the third area is accessible from the second direction.

In this way, and in accordance with important aspects of the present invention, the switchgear 10 provides desirable operating characteristics and convenient operation in various mounting orientations and environments. Thus, viewing of the position of the switch blades 203 through the viewing windows, e.g. 204, and operation of the switch blades 203 via the controls, e.g. operation selector 214, may be performed from a first position with respect to the top surface 206. From that first position, there is no exposure to or any interference from the cable terminations on the bushings 220. Further, handling of the cables on the bushings 220, e.g. for connection and disconnection of the elbows, may be performed from a second convenient position at the front of the switchgear 10.

For example, referring to FIG. 3, operating personnel at 228, can view the open position of the switch blade 203 from a position above the switchgear 10 generally along a first direction generally referred to at 252 while standing on a surface referred to generally at 226. The controls, e.g. operation selector 214, may be operated and/or the viewing windows, e.g. 204, may be utilized from a kneeling or crouching position. If the switchgear 10 is located in a pit below the surface 226, viewing into the switchgear 10 and operating the controls (e.g. operation selector 214) of the second array 215 may be performed from the surface 226 without entering the pit and without being exposed to the environment of the bushings 220 and associated cables. Further, if it is desired to disconnect the cables from the bushings 220, the operating personnel may manipulate the cables with a shotgun stick or the like while standing on the surface 226 from a position at the front of the switchgear generally along a second direction referred to generally at 254, i.e. the second position referred to above. These operations are performed without entering the pit. Reference may be made to the aforementioned copending application Ser. No. 08/653,176 filed May 24, 1996 in the names of B. B. McGlone et al. for a more detailed discussion of operation with respect to the switchgear in a pit. The switchgear 10 may also be arranged such that the top surface 206 with the arrays of viewing windows and controls is generally vertical while the bushings 220 are arranged to so as to generally be oriented upward or downward for convenience of operation.

Of course, in other arrangements, it should be realized that the switchgear 10 is further arranged inside an enclosure of the various types available for pad-mounted gear. For example, as shown in FIG. 1, lower end panels with support legs 230, 232 are provided on the housing 200 for use in an enclosure or for mounting on a surface. Additionally, upper end panels with lifting brackets 234, 236 are provided for use in transporting and maneuvering the switchgear 10. The housing 200 may be fabricated either from various metals (e.g. 7-gauge mild steel) or insulating materials, as suitable for the specific structural support requirements.

Thus, the switchgear 10 via the predetermined configuration of the housing 200 and the arrangement of the third array 218 of external interconnections, the first array 205 of viewing windows, and the second array 215 of controls provides a versatile switchgear lineup that facilitates desirable operating characteristics and that is capable of being mounted in various desirable configurations and orientations. For example, with the switchgear 10 located in a pit in the relative position as shown in FIG. 3, operating personnel can perform all operations such as switching, isolating, grounding, voltage testing and phasing without any exposure or access to the high voltage areas. This is possible since direct observation of the position of the switch blades 203 and access to the operating controls are readily available by personnel from above ground and from the first direction 252. For those operations that require elbow/cable manipulation via a hot stick or the like, access is from the front of the switchgear from the second direction 254.

As disclosed in the aforementioned U.S. Pat. No. 5,521, 567, the switchgear 10, in a preferred embodiment, also includes a complete internal and integral system to satisfy desirable operating practices to deenergize, test and ground the circuit before working thereon.

Figure 4:
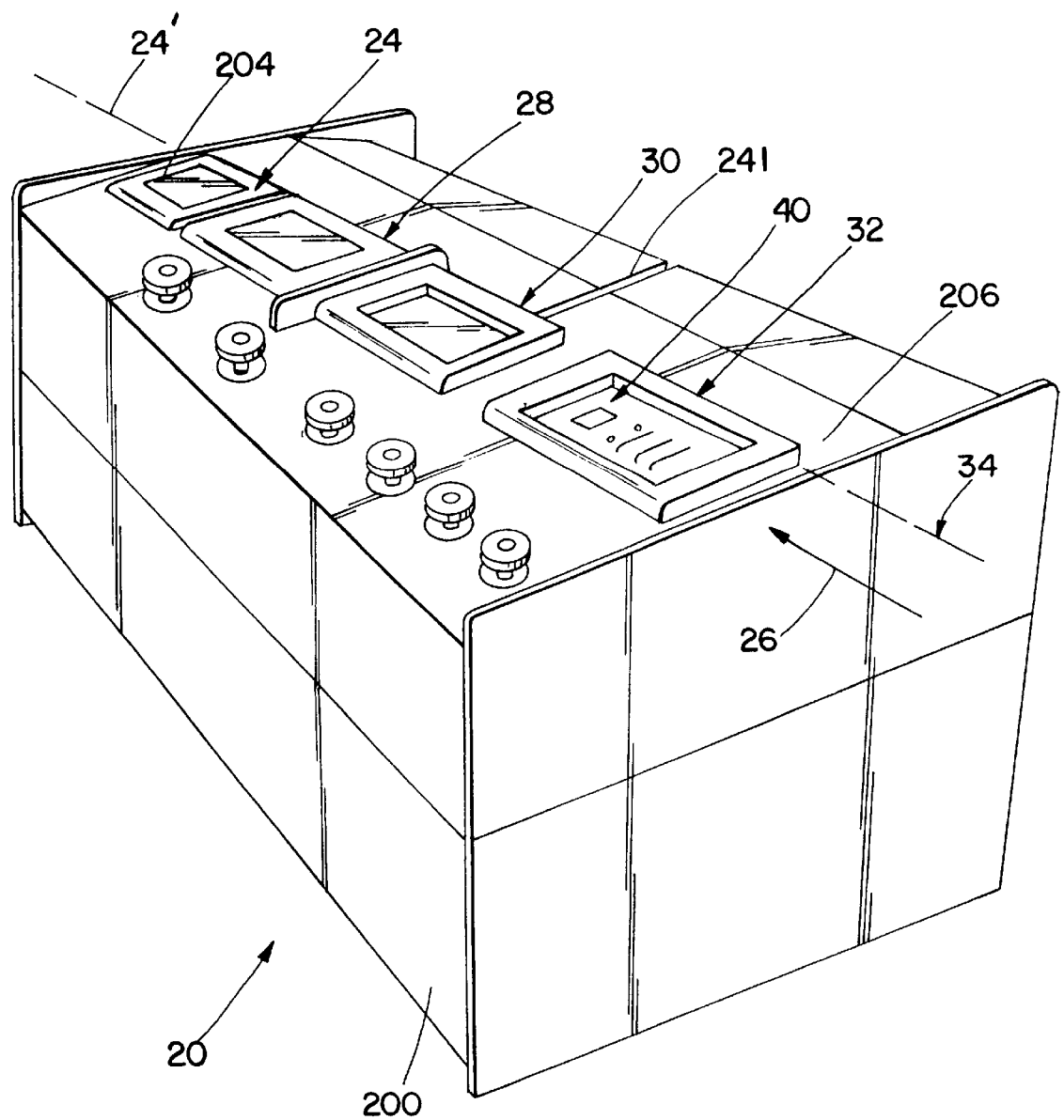
FIG. 4 is a perspective view of a second embodiment of switchgear according to the present invention.

Considering now other important aspects of the present invention and referring now additionally to FIGS. 4–9, the switchgear 20 of FIG. 4 additionally includes one or more displays, e.g. 24 which provide information about the status of the circuit and components of the switchgear 20. The displays such as 24 are located along the top surface 206 of the housing 200, preferably arranged as an aligned row or fourth array 26, with one display, e.g. 24, so as to overlie (i.e. aligned immediately above) one of the viewing windows, e.g. 204. For example, as shown in FIG. 4, displays 24, 28, 30, and 32 are arranged above the respective viewing windows 204, 208, 210 and 212. The displays 24, 28, 30, and 32 are pivotally mounted along an axis 34 with respect to the housing 200 such that the displays 24, 28, 30 and 32 may be lifted to permit observation through the respective windows 204, 208, 210, and 212 with an observer positioned over the controls of array 215, e.g. from the first direction 252 as shown in FIG. 3. In this manner, with the displays as shown in FIG. 4, circuit conditions may be ascertained via the information on the displays, while in the open position, indicated at 24' in FIG. 4 and 6, the position of the switches may be directly observed. Further, the displays 24, 28, 30 and 32 when in the closed position of FIG. 4 also function as flashcovers over the respective windows 204, 208, 210 and 212, e.g. to avoid any flash effect through the windows to observers that may occur during switching operations when fault conditions are present.

As seen in FIG. 6, the window 204 is assembled to provide a seal to the housing 200 via a frame member 44 around the perimeter of the window 204 and clamps 46 which clamp the frame member 44 and the window 204 against the inner surface of the housing 200, a sealing agent or the like being provided between the top surface of the perimeter of the window 204 and the housing 200. The clamps 46 are secured to the housing 200 via threaded studs 47 extending from the housing 200 and passing through the clamps 46 and nuts 48 threaded onto the studs 47 to provide appropriate clamping forces.

Figure 5:
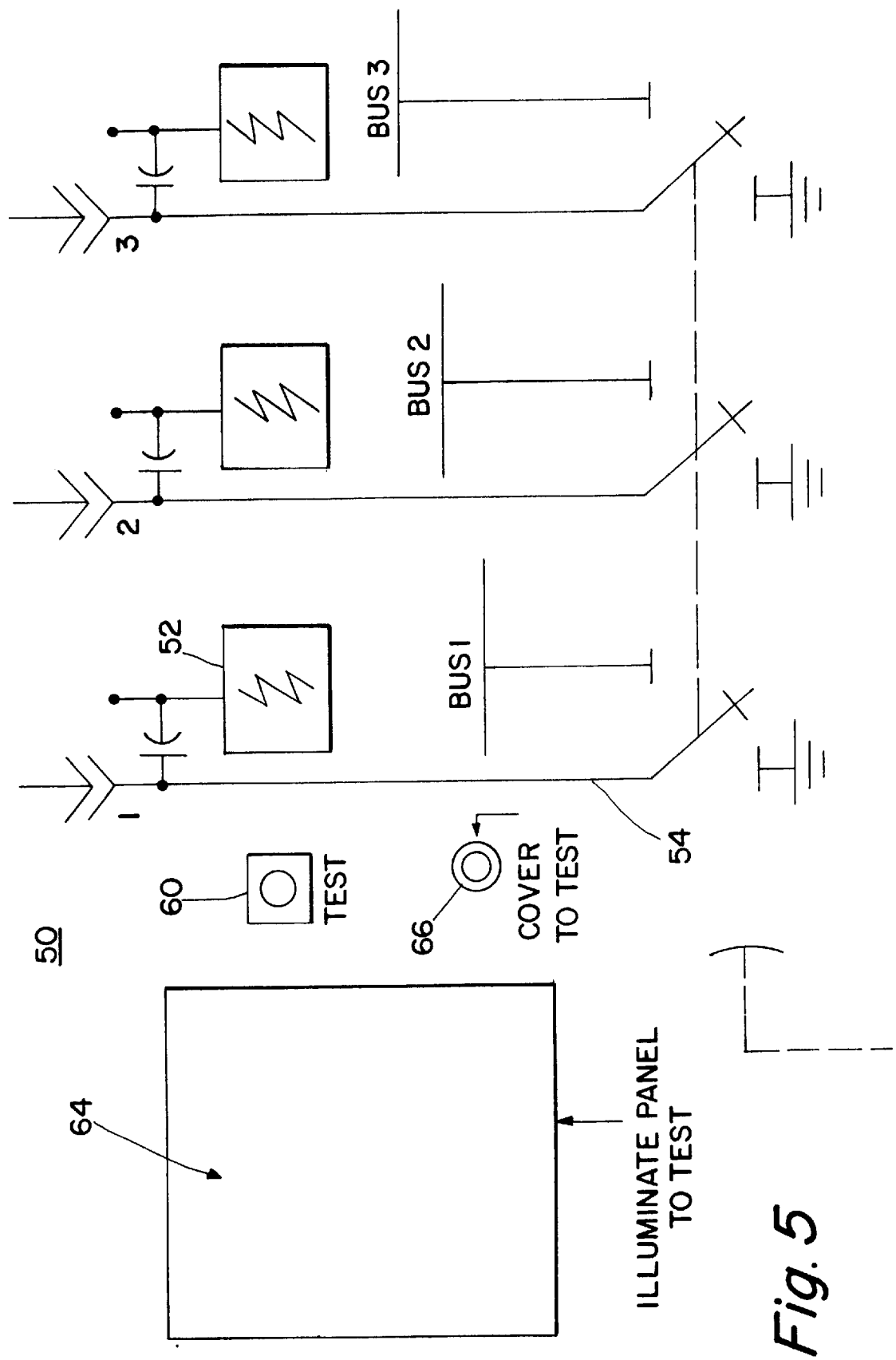
FIG. 5 is a diagrammatic representation of the layout of a display for the switchgear of FIG. 4.

In a specific arrangement, each of the displays 24, 28, 30 and 32 includes a display panel 40 with various indicia and indicators to represent the energized/deenergized status of each pole of the overlied load interrupter switch or fault interrupter. For example, a diagrammatic representation of the layout 50 of the indicia and indicators of an illustrative display panel 40 is shown in FIG. 5. Specifically, each pole includes a voltage indicator 52 and a line diagram 54 representing the electrical circuit and the load interrupter switch or fault interrupter (a load interrupter switch being illustrated in FIG. 5). A test indicator 60 and the voltage indicator 52 provide information on the operable status of the display panel 40 and the integrity of the voltage sensing system for each pole. Reference may be made to the aforementioned U.S. Pat. No. 5,521,567 for a further discussion of the testing of the integrity of the voltage sensing system. Voltage sensing and circuit testing signals are provided via conductors in a cable 241 (FIGS. 4 and 6) for each of the display panels 40, the cable 241 being connected to a sensor (not shown) arranged at the cable terminations 220.

In the illustrative example of the display panel 40, the test indicator 60 displays a predetermined test symbol, e.g. a solid circle, when the display panel 40 is appropriately sequenced for testing. In the specific illustration, for testing purposes, the display 24 is powered by a solar panel 64. Additionally a test actuator 66 is provided that includes a transparent window over an optical switch at 66. The display panel 40 is arranged to actuate a test sequence in response to the blocking of light to the optical switch at 66 while the solar panel 64 is illuminated sufficiently to provide power to actuate the display panel 40 and test circuit. Thus, after the user covers the test actuator 66, the display of the test symbol in the test indicator 60 provides assurance that the display panel 40 is appropriately powered up and fully functioning. With the test indicator displayed at 60, the user may then ascertain the operability of each voltage indicator 52 and the integrity of the voltage sensing circuit for that corresponding pole.

In a specific embodiment, the voltage indicator 52 flashes the energized symbol, e.g. lightning bolt or the like, in the test mode to verify that the voltage indicator 52 is functional and the voltage sensing circuit is fully functional and reliable. Following this test function, i.e. after the operator unblocks the transparent window over the optical switch at 66, the energized/deenergized status of each pole may then be ascertained via the status of the voltage indicator 52 provided for each respective pole, for example 52b and 52c for the respective second and third poles of the display panel 40. In a specific embodiment, while the voltage indicators 52 are arranged for normal functioning, the operator before relying on the absence of an energized symbol at the voltage indicator 52, activates the testing mode of the display 40 via the feature at 66 and observes the test symbol at 60 and checks for the presence of the energized symbol at 52 to determine proper operation. Without such appropriate testing, the voltage indicators 52 in themselves would function only as ordinary indicators as found in the prior art.

Figure 25:
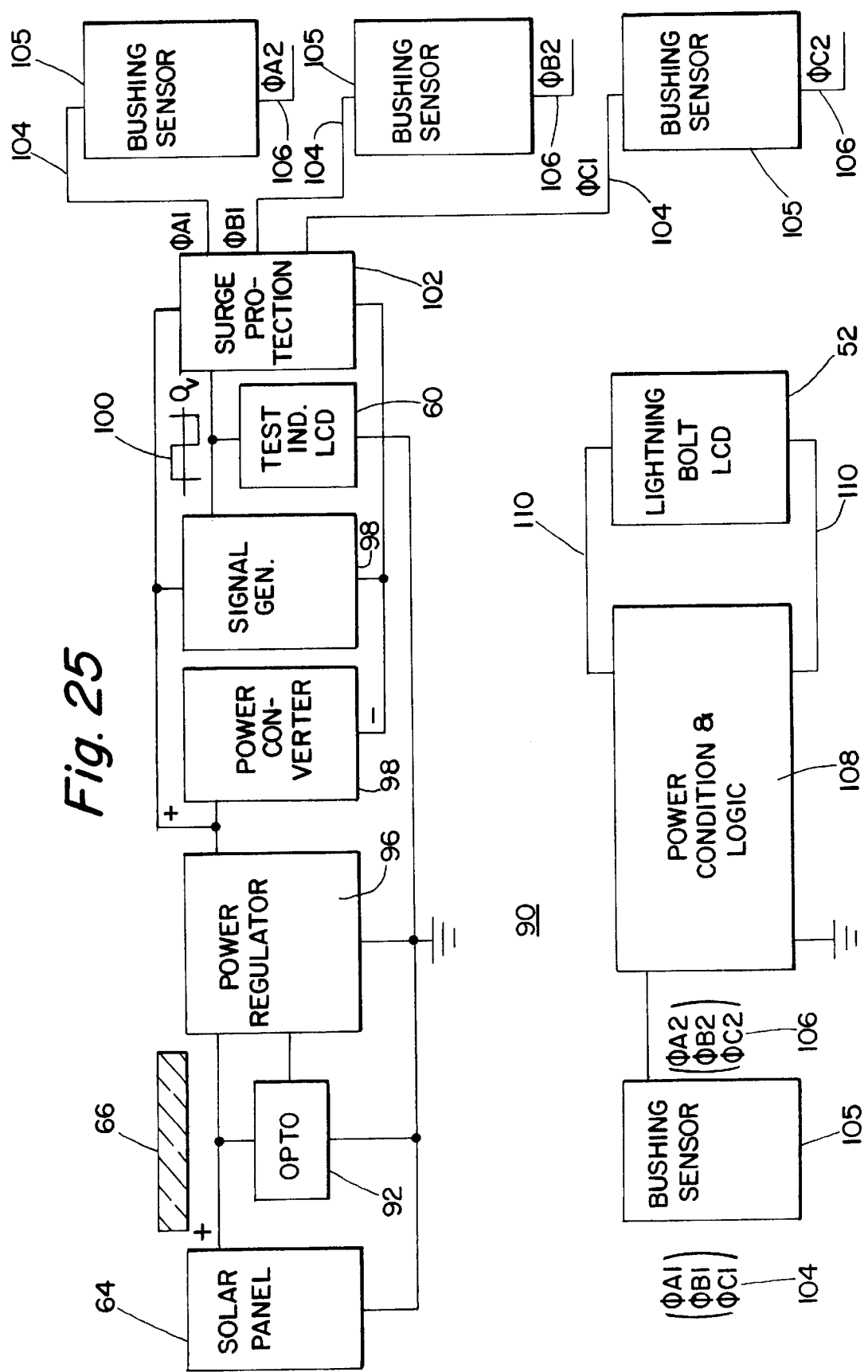
FIG. 25 is a block diagram electrical schematic diagram of portions of the display and testing features of the switchgear of FIGS. 4–19.

Referring now additionally to FIG. 25, the testing circuit 90 of the display panel 40 is powered by the solar panel 64 and actuated by the test actuator feature at 66. When the optical switch 92 is turned off by the blocking of light at 66, the optical switch 92 via path 94 activates a power regulator stage 96. The power regulator stage 96 supplies power to the power converter and signal generator stages referred to at 98 which actuate the test indicator 60 with a suitable alternating wave signal at 100. The alternating wave signal at 100 via a surge protection stage 102 provides signals for each phase at 104 which are connected to the testing line routed over the cable 241 (FIGS. 4 and 6) to the bushing sensors 105 located at the terminations 220. This signal path tests the integrity of the overall sensing circuit. If the sensing path is fully functioning, the signal will be returned at 106 on the lines from the bushing sensors 105. The signal at 106 is then processed by a power condition and logic stage 108 which provides protection and the desired indicator waveform at 110 to drive the voltage indicator 52, e.g. a flashing signal. Accordingly, the testing circuit 90 of the display 40 when actuated by the test actuator feature at 66 checks the integrity of the signal paths from the sensor and activates the voltage indicators at 52 to also test the integrity of the voltage indicators 52. As discussed hereinbefore, if the voltage indicator 52 is not actuated during the testing mode with the testing indicator actuated, the operator is alerted that the voltage indicators 52 are not working and not to be relied upon.

Figures 7, 9:
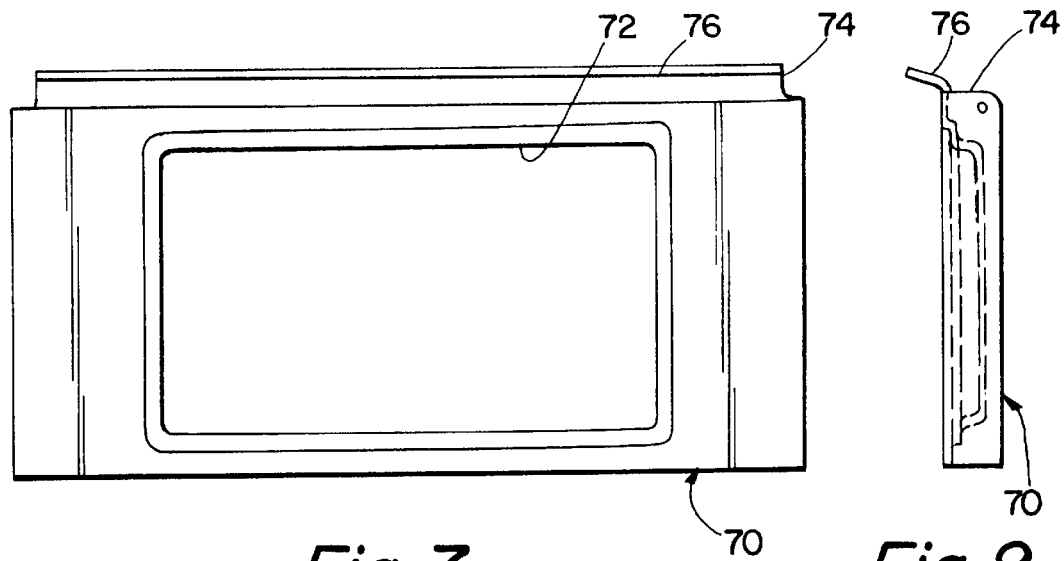
FIGS. 7–9 are respective top plan, and front and right-side elevational views of the display of the switchgear of FIGS. 4 and 6.
Figure 8:
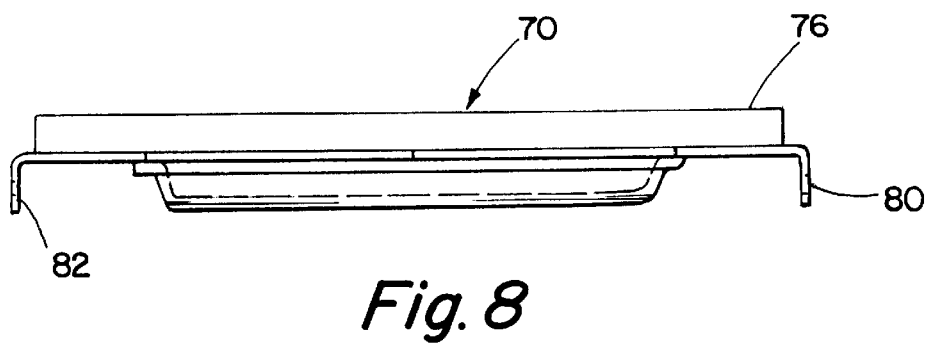

Referring now to FIGS. 7–9 and considering the specific structure of an illustrative display 24, the display 24 includes a cover member 70 that is preferably fabricated as a molded part and provides a receptacle 72 for the display panel 40. A trailing edge 74 of the cover member 70 includes a sloped, upstanding lip 76 which is arranged to contact the top surface 206 of the housing 200 when pivoted to define a stop for the open position of the cover member 70 and display 24. Along the trailing edge 74, the cover member 70 also includes pivot bearing holes 78, 80 for receiving pivot pins 82 (FIG. 6) along the axis 34, the pivot pins 82 being supported by flange members 83 extending from the housing 200.

Figure 13:
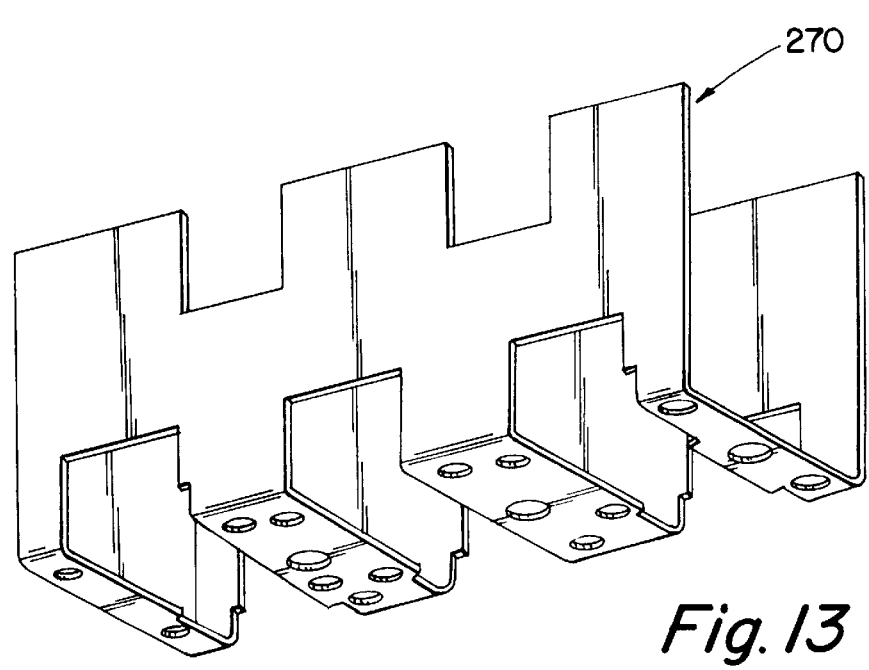
FIG. 13 is a perspective view of a mounting channel for the multiple pole-unit assembly of FIGS. 10–12.
Figure 10:
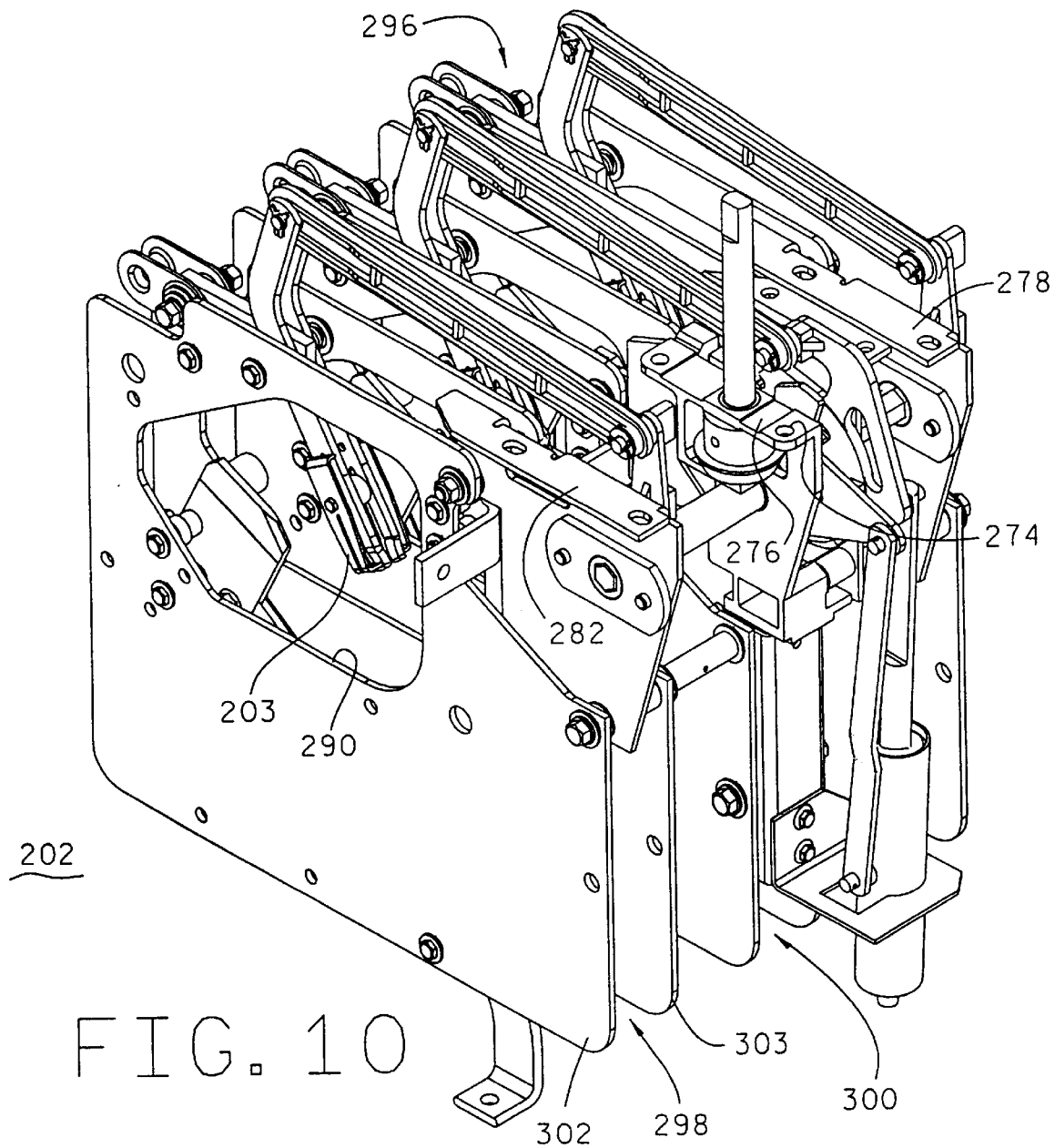
FIGS. 10–12 are respective perspective, front elevational and top plan views of a multiple pole-unit assembly of the switchgear of FIGS. 4 and 6.
Figure 11:
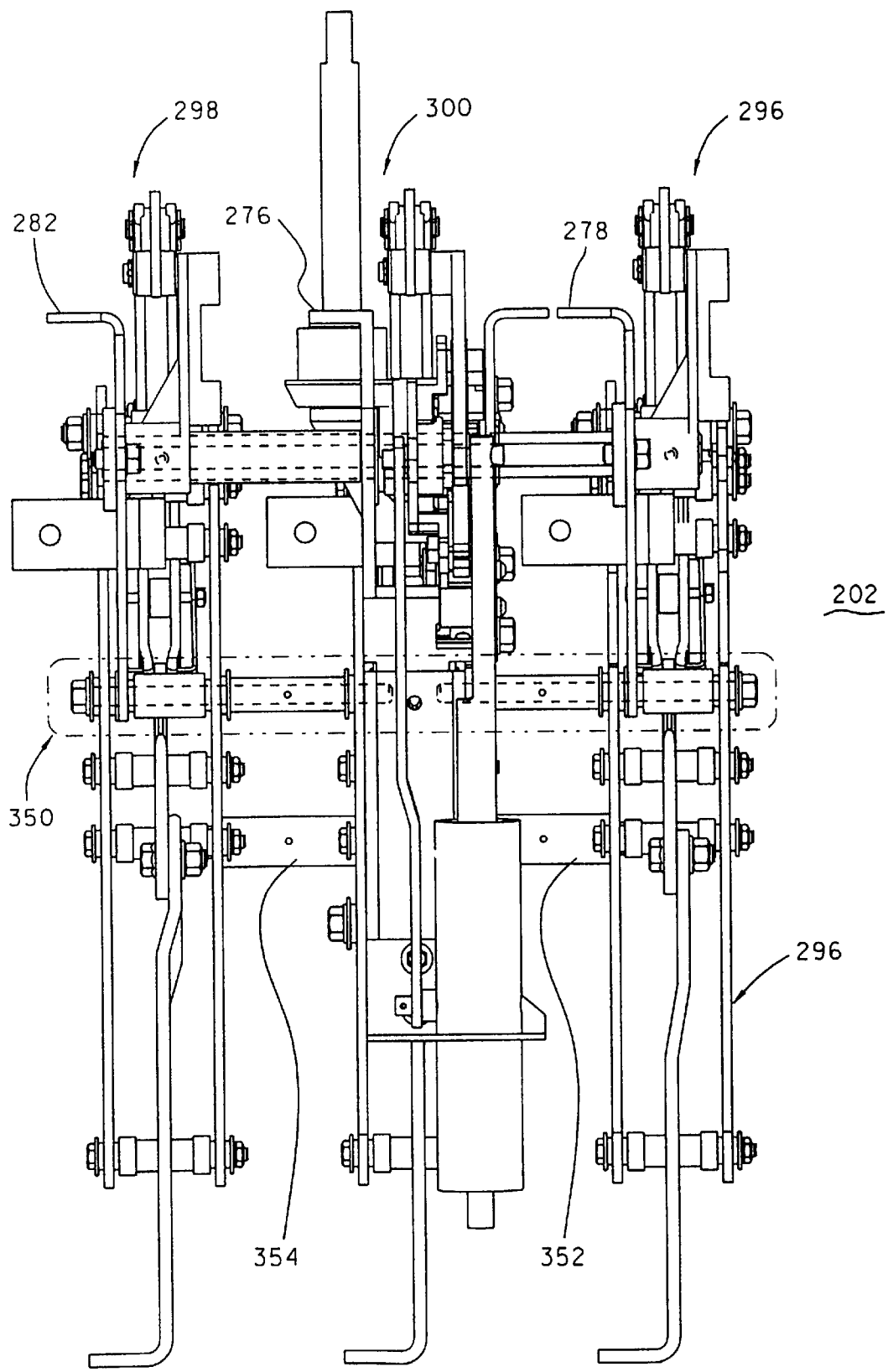
Figure 12:
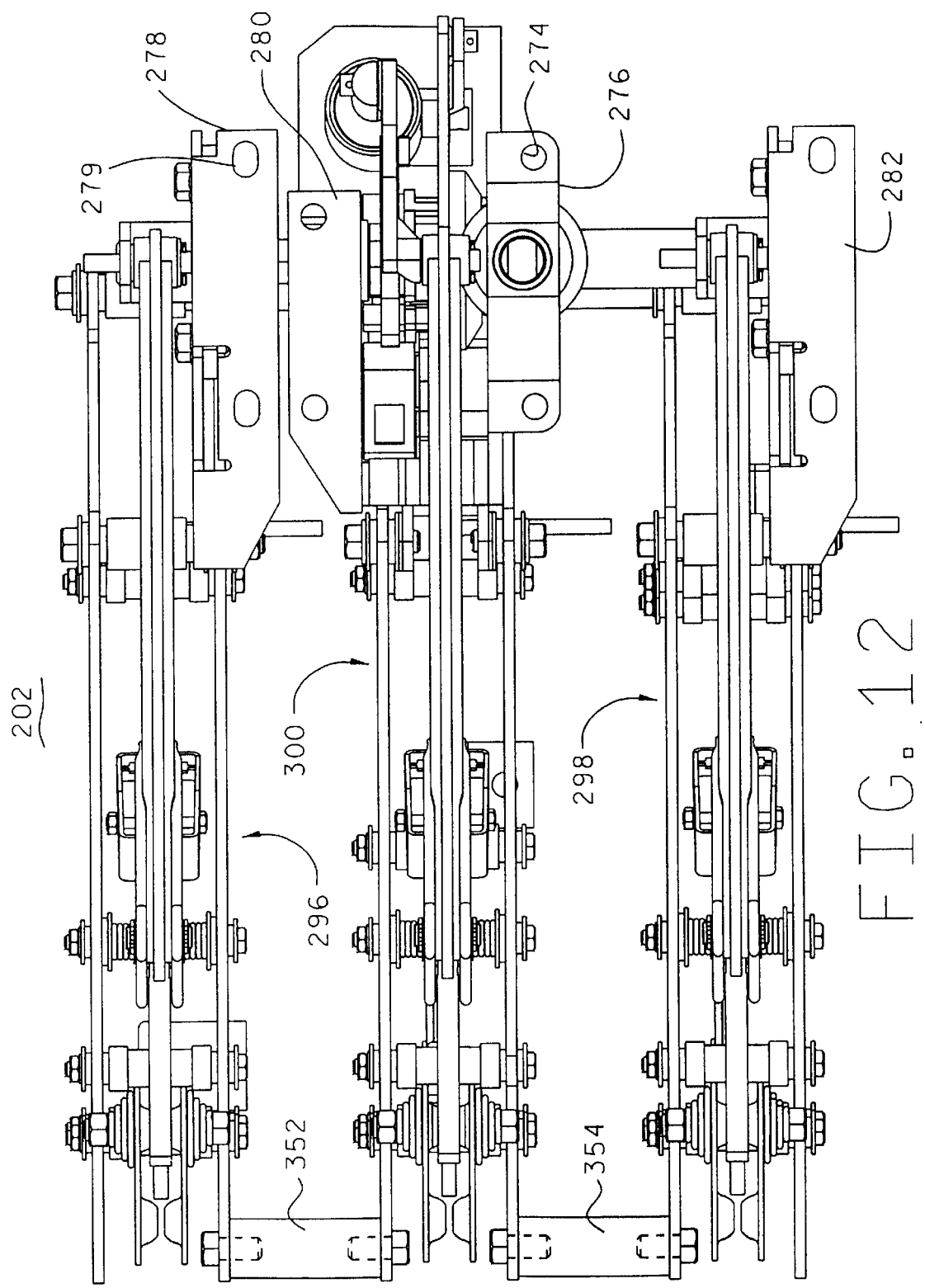

Referring now additionally to FIGS. 10–13 and in accordance with important aspects of the present invention, in a preferred embodiment the load interrupter switch 202 is provided as a multiple pole-unit assembly, e.g. as specifically illustrated in FIGS. 2 and 3, the load interrupter switch 202 includes three poles. The load interrupter switch 202 is suspended with respect to the housing 200 via a support channel 270 (FIGS. 2, 6 and 13). The support channel 270 (best seen in FIG. 13) is affixed to the inner wall of the top surface 206 of the housing 200 (FIG. 6). The load interrupter switch 202 is affixed to the support channel 270 (FIG. 6) via fasteners 272 which are threaded into threaded sleeves 273 in the support channel 270. As seen in FIGS. 10–12, the fasteners 272 extend through apertures 274 in a mounting flanges 276 of the operating mechanism 250 and additional mounting flanges, e.g. 278, 280 and 282 of the load interrupter switch 202. As seen in FIG. 6, the operating shaft 242 extends through the support channel 270 and the top surface 206 of the housing 200 via an aperture 243, shaft 242 also including suitable seals not shown in detail.

It should be noted that the mounting of the load interrupter switch 202 from a single edge or corner of the overall generally rectangular parallelepiped assembly not only simplifies assembly and allows flexibility in the configuration of the assembly 202, it also minimizes the structural rigidity requirements for the housing 200 relating to alignment and mounting of components. Additionally, this technique positions the assembly 202 centrally of the interior of the housing 200 while also providing support and alignment for the operation selectors 216 and the operating shaft 242 that drives the operating mechanism 250. In order to achieve the desired structural rigidity with particular materials. one or more ribs 240 may be provided along the top of the housing 200 as shown in FIGS. 4 and 6. Where such ribs 240 are provided, the rib 240 may also be utilized to support the pivot pins 82 of the display, e.g. 28, in lieu of the flange members 83.

In accordance with important aspects of the present invention and with reference to FIG. 10, to enhance the visibility of the switch blade 203 in the various positions, i.e closed, open and ground, and especially the open position to observe the visible open gap, the load interrupter switch 202 includes openings 290 arranged in a predetermined manner, and additionally, the colors of the various components of the load interrupter switch 202 are selected to enhance visibility. For example, support sheets 301, 303 are black, blade portions 292 of the switch blade 203 are silver, and portions 294 of the switch blade 203 are orange. Thus, in this manner, the silver color of the blade portions 292 are easily visible and the orange portions 294 assist to focus on the position of the open gap.

Figure 14:
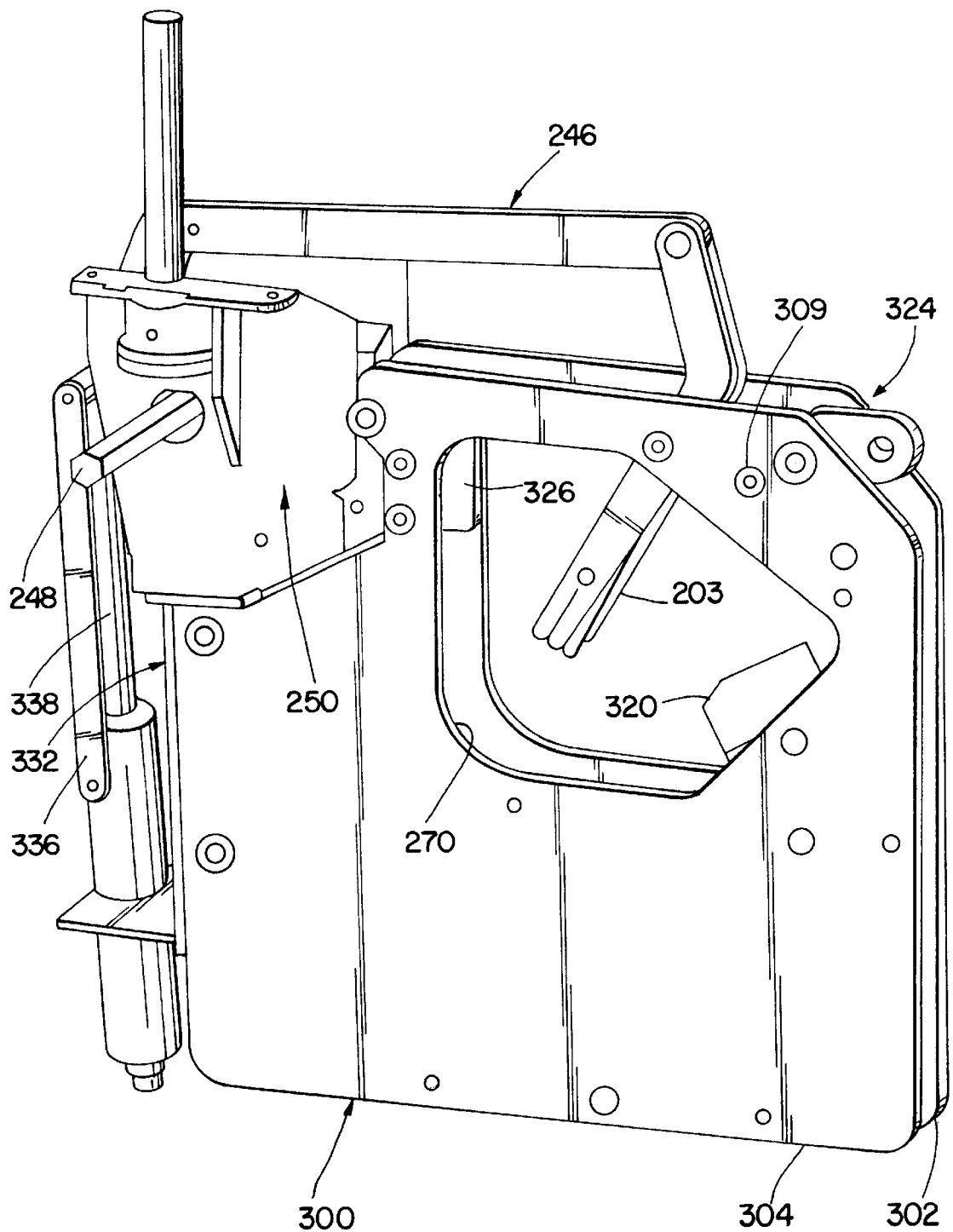
FIG. 14 is a perspective view of a pole-unit assembly of the multiple pole-unit assembly of FIGS. 10–12.
Figure 15:
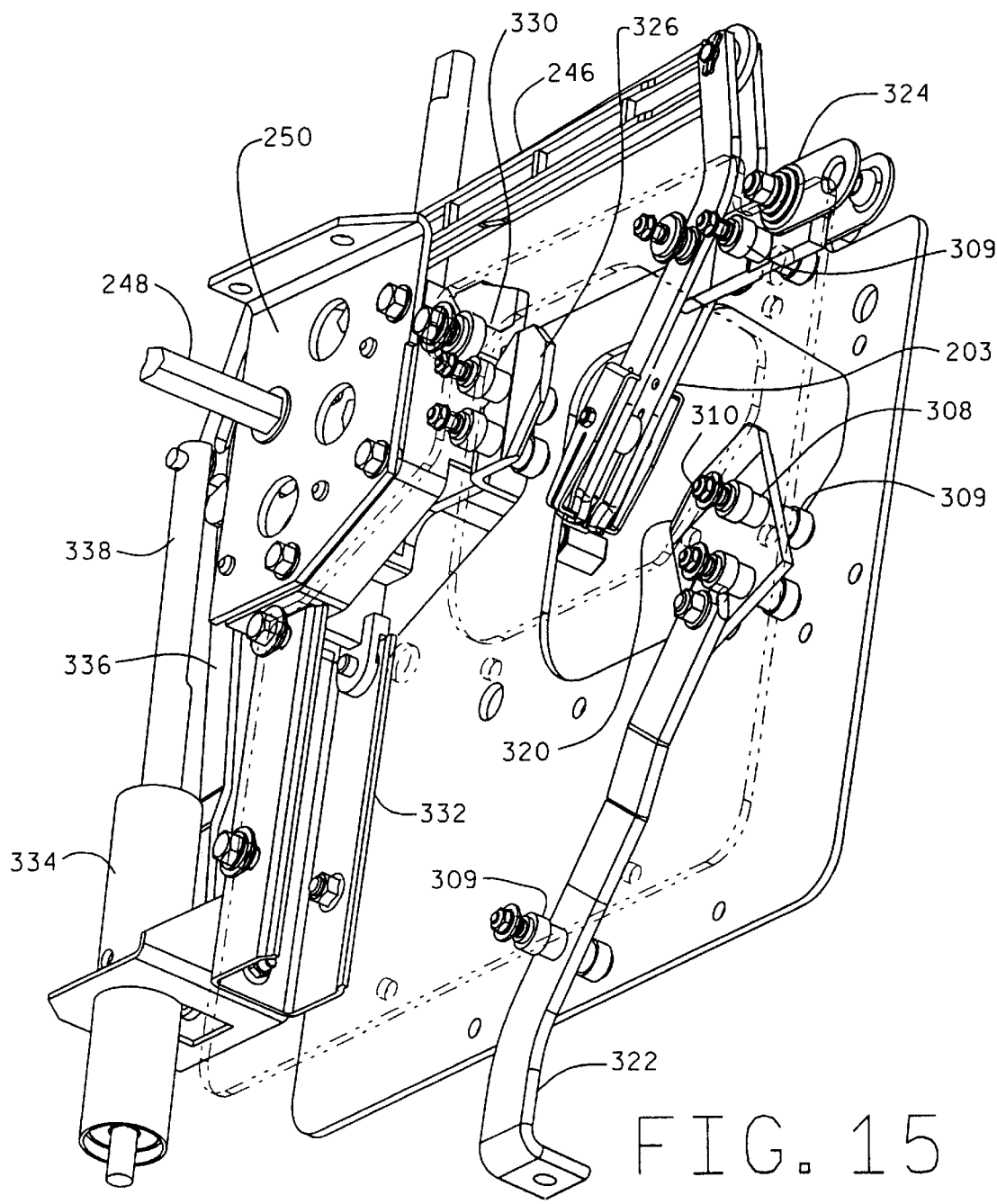
FIG. 15 is a perspective view of the pole-unit assembly of FIG. 14 with one of the support sheets removed for clarity.

Turning now to a more detailed discussion of the individual pole units of the load interrupter switch 202, the load interrupter switch 202 includes three pole-unit assemblies 296, 298 and 300, the center pole unit 300 including the operating mechanism 250. Referring now additionally to FIGS. 14–15, the illustrative pole unit 300 includes the support sheets 302, 304. The support sheets 302, 304 are non-conductive and arranged so as to be spaced apart and generally parallel to each other with components and interconnections mounted between and with respect to the support sheets 302, 304. The support sheets 302, 304 are spaced apart and fastened to each other by spacer arrangements generally referred to at 309, e.g. as specifically illustrated in FIG. 15, sleeves 308 and bolts 310 passing therethrough.

Thus, the support sheets 302, 304 support and provide accurate alignment for and between the components as well as provide electrical isolation between the support points of the illustrative pole-unit assembly 300. In addition to the switch blade 203, the components of the pole unit 300 include a stationary contact assembly 320, a bus-interconnection conductor 322 that is provided for interconnecting the stationary contact 320 to a through bus (not shown) of the lineup, an interconnection assembly 324 for connecting the movable switch blade 203 to the bushing 220, and a ground interconnection assembly 326. Additionally, the operating mechanism 250 is attached to the pole unit 300 via fasteners cooperating with extending tabs 330 of the operating mechanism 250 and a support and guide bracket 332 affixed to the operating mechanism 250 and affixed between the support sheets 302, 304 via fasteners. An operating-spring housing 334 is carried by the support and guide bracket 332. The operating-spring housing 334 includes a charging link 336 connected to the operating mechanism 250 and a drive link 338 that provides input drive force to the operating mechanism 250.

Considering now in more detail the load interrupter switch assembly 202, the 3-pole, load interrupter switch assembly 202 is formed by combining and fastening together three pole-unit assemblies 296, 298 and 300, which are appropriately spaced apart and fastened together by the fastening arrangement generally referred to at 350. Additionally, pole-to-pole spacer/support arrangements 352, 354 are provided between each of the respective pole unit assemblies 296 and 298 and located approximately midway along the rear (left in FIG. 12) edge of the pole unit assemblies.

Figure 16:
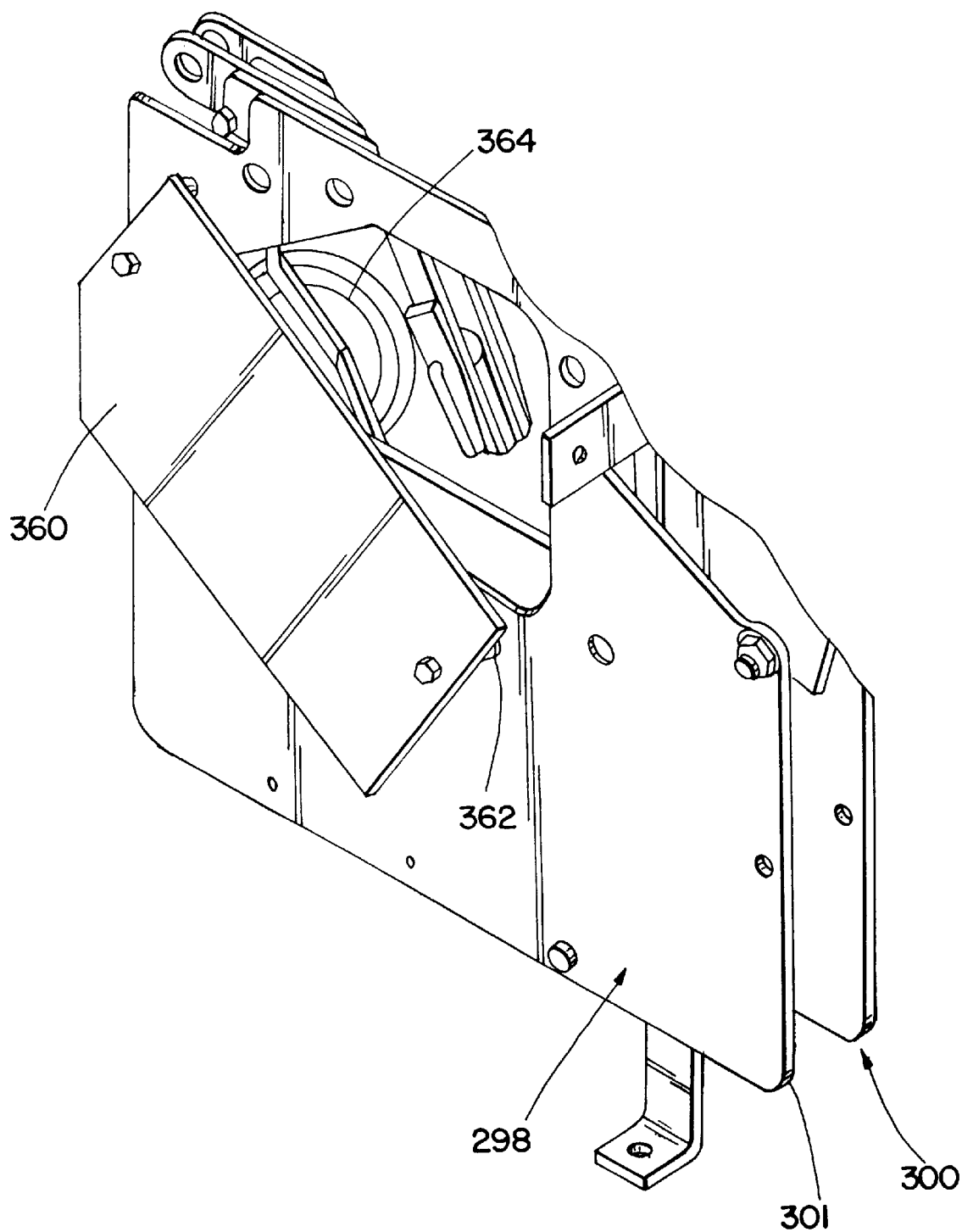
FIG. 16 is a partial perspective view of a pole-unit assembly similar to FIGS. 14 and 15, but with additional features for a higher operating voltage.

In accordance with important aspects of the present invention, the spacer arrangements 309, pole-to-pole spacer/support arrangements 352, 354, and the fastening arrangement 350 are varied in dimensions in specific embodiments of the present invention to provide load interrupter switches having different operating voltage specifications and different basic insulation levels, e.g. in the range of 95–150 kV. Additionally, and with additional reference to FIG. 16, the load interrupter switch of FIGS. 10–15 is provided with an additional phase barrier 360 to achieve a higher voltage rating for the load interrupter switch 202 via spacer arrangements 362 affixed to the support sheet 301, a phase barrier 360 additionally being provided between each of the pole unit assemblies 296, 298 and 300, as well as the outside of the pole unit assembly 296. In a specific embodiment, a cylindrical arc runner 364 is also added at the main stationary contact 326 (FIG. 14).

Figure 17:
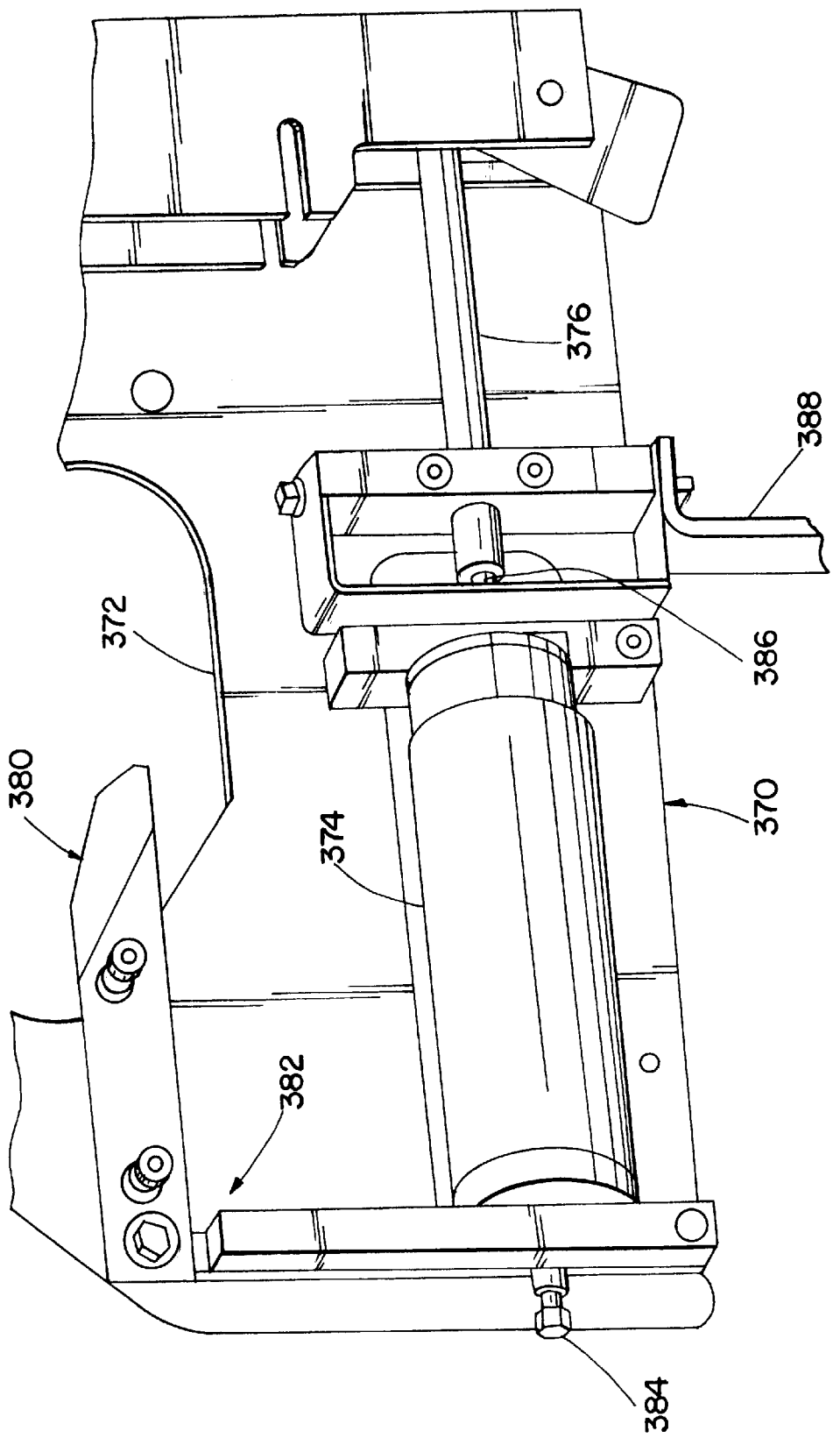
FIG. 17 is a partial perspective view of a pole-unit assembly similar to FIGS. 14 and 15 but including a fault interrupter.

Referring now additionally to FIG. 17, the switchgear of the present invention also includes fault interrupters, one pole assembly 370 of which is shown in FIG. 17, with one of the support sheets 372 removed for clarity. The fault interrupter pole assembly 370 is similar to the load interrupter pole unit assembly 300 of FIGS. 10–15, with the assembly 370 further including a vacuum interrupter 374, an actuator linkage 376, and a fault interrupter operating mechanism that is similar to the operating mechanism 250 but additionally includes a fault interrupter output at 380 to operate the fault interrupter 374. Reference may be made to U.S. Pat. No. 5,504,293 for a more detailed discussion of these types of operating mechanisms. The main stationary contact at 380 is connected via arrangement 382 to a first contact 384 of the fault interrupter 374, a second contact 386 of the fault interrupter 374 being connected to a pole bus arrangement at 388. The remaining parts and components of the pole unit assembly 370 are generally similar to the pole unit 300.

Since the support sheets of the pole units (e.g. the support sheets 302, 304 of the pole unit 300) support and mount energized and grounded components on the same pole unit, dielectric stress is a factor that must be considered. For example, referring now to FIGS. 20–21, with the illustrative energized component 390 and the illustrative ground potential component 392 mounted in the range of 4–5 inches apart on the support sheet 302, dielectric stress occurs at the mounting locations generally referred to at 394, 396. As illustrated in FIG. 21, if conventional metallic fasteners such as the bolt 398 are used to mount the components, high stress occurs in a relatively small gap referred to at 391. This dielectric stress reduces the maximum operating voltage and basic insulation levels.

Considering now additional important aspects of the present invention to reduce dielectric stress at the mounting locations of the components within each of the three pole-unit assemblies 296, 298 and 300 of the load interrupter switch assembly 202, separation spacers 393 are provided at the mounting locations 394, 396. Conventional fasteners 398 are disposed through the separation spacers 393. Referring now additionally to FIGS. 22–23, the separation spacers 393 include a widened shielding ring 395 and a narrowed sleeve portion 397 that functions as a separation member. Both the widened shielding ring 395 and the narrowed sleeve portion 397 are conductive. With this arrangement, and referring now additionally to FIG. 24, the dielectric stress in the gap 391 at the support sheet 302 is reduced with the widened shielding ring 395 preventing the concentration of stress at the gap 391. It has been found that a suitable reduction in dielectric stress is achieved with the overhang of the widened shielding ring 395 referred to at 399 being in the range of one to two times the width of the narrowed sleeve portion referred to at 401. As seen in FIG. 22, preferably the separation spacer 393 includes a knurled sleeve portion 403 which provides increased retention and stability of alignment of the components. While not necessary to make and use the invention, it is theorized that the widened shielding ring 395 combined with the separation distance 401 shields the gap at 391 formed between the wall of the supporting sheet 302, the component 390, and the surrounding fluid environment, i.e. at the triple point of the interface. Accordingly, the separation spacers 393 are utilized in the pole-unit assemblies 296, 298 and 300, e.g. at locations 309 in FIG. 15.

Figure 18:
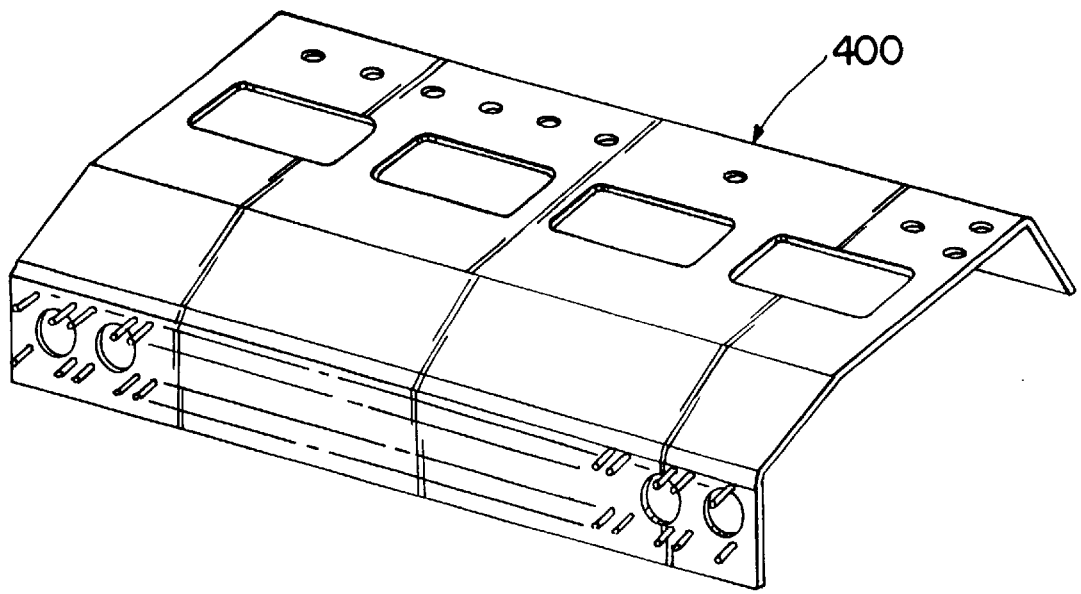
FIGS. 18 and 19 are perspective views of respective top and bottom housing portions of the housing for the switchgear of FIGS. 4 and 6.
Figure 19:
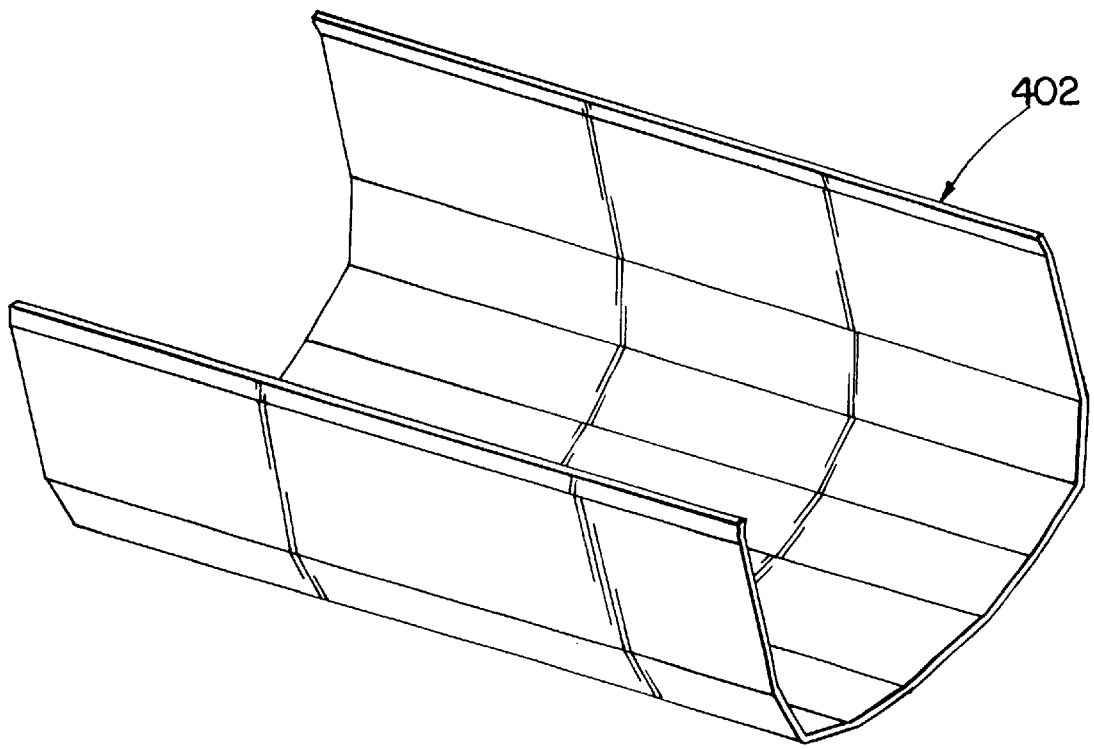

Considering now the assembly of the switchgear 10 and 20, and referring now additionally to FIGS. 18 and 19, the housing 200 is provided by a top housing portion 400 and a bottom housing portion 402. The upper end panels 236, 238 are affixed to the upper housing portion 400, and the lower end panels 230, 232 are affixed to the sides of the lower housing portion 402. After the various pole unit assemblies such as the load interrupter switch 202 are mounted within the upper housing portion 400 via the mounting channels 270, and the desired electrical connections are made to the terminations 220 and the desired interbus connections are made between the various pole unit assemblies, the upper housing portion 400, with the assembled pole unit assemblies, and the lower housing portion 402 are assembled, e.g. via welded along the seams thereof. Then the assembly is sealed and pressurized with a suitable insulating medium, e.g. $SF_6$ gas.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

What is claimed and desired to be secured by Letters Patent of the United States is:

1. A pole-unit assembly for medium-voltage switchgear comprising electrical components, at least two spaced apart generally planar support members, and means for supporting said electrical components intermediate said two spaced apart generally planar support members, said electrical components being operable at different voltage potentials, said planar support members being non-conductive, and said supporting means comprising means for reducing dielectric stress at said two spaced apart generally planar support members.

2. A pole-unit assembly for medium-voltage switchgear comprising electrical components, at least two spaced apart generally planar support members, and means for supporting said electrical components intermediate said two spaced apart generally planar support members.

3. The pole-unit assembly of claim 1 wherein said pole-unit assembly has a general overall rectangular parallelepiped shape and further comprises means for mounting said pole-unit assembly with respect to a planar surface, said mounting means being located along one edge of said pole-unit assembly.

4. The pole-unit assembly of claim 1 wherein said electrical components of said pole-unit assembly comprise a multi-pole switch having two or more operating positions and bus connection means for each pole of said multi-pole switch.

5. The pole-unit assembly of claim 1 further comprising an operating mechanism for operating said electrical components.

6. The pole-unit assembly of claim 5 wherein said electrical components of said pole-unit assembly comprise a multi-pole switch having two or more operating positions, said operating mechanism including means for operating said multi-pole switch between said two or more operating positions.

7. The pole-unit assembly of claim 6 wherein said pole-unit assembly has a general overall rectangular parallelepiped shape and further comprises means for mounting said pole-unit assembly with respect to a planar surface, said mounting means being located along one edge of said pole-unit assembly.

8. The pole-unit assembly of claim 7 further comprising operating control means extending from said operating mechanism for controlling operation of said operating mechanism.

9. The pole-unit assembly of claim 8 wherein said mounting means is adjacent said operating control means.

10. A pole-unit assembly for medium-voltage switchgear comprising electrical components, at least two spaced apart generally planar support members, means for supporting said electrical components intermediate said two spaced apart generally planar support members, and means for enhancing the visibility of said electrical components including the color of said electrical components and the color of said generally planar support members.

11. A pole-unit assembly for medium-voltage switchgear comprising electrical components, at least two spaced apart generally planar support members, and means for supporting said electrical components intermediate said two spaced apart generally planar support members, said electrical components being operable at different voltage potentials, said planar support members being non-conductive and said supporting means further comprising means for providing a substantially conductive path from said electrical components to said two spaced apart generally planar support members.

12. The pole unit of claim 11 further comprising a plurality of said spaced apart generally planar support members to define a multiple pole component assembly including said electrical components being mounted between respective pairs of said plurality of spaced apart generally planar support members.

13. A pole-unit assembly for medium-voltage switchgear comprising electrical components, at least two spaced apart generally planar support members, and means for supporting said electrical components intermediate said two spaced apart generally planar support members, said electrical components being operable at different voltage potentials, said planar support members being non-conductive, and said supporting means comprising fastener means and means for reducing dielectric stress at said two spaced apart generally planar support members.

14. The pole unit assembly of claim 13 wherein said dielectric stress reducing means comprises widened ring portions extending from said fastener means adjacent said two spaced apart generally planar support members.

15. A medium-voltage multiple-pole component assembly comprising a plurality of pole-unit assemblies each operative at different voltage potentials and means for assembling said plurality of pole-unit assemblies in spaced apart relationship to each other, each of said pole-unit assemblies comprising two spaced apart support members, electrical components operative at different voltage potentials, and means for supporting said electrical components intermediate and with respect to said two spaced apart support members, said spaced apart support members being generally planar and non-conductive, said supporting means comprising conductive fastener means.

\* \* \* \* \*